US008395428B2

(12) United States Patent
Mateman et al.

(10) Patent No.: US 8,395,428 B2
(45) Date of Patent: Mar. 12, 2013

(54) REFERENCE CLOCK SAMPLING DIGITAL PLL

(75) Inventors: Paul Mateman, Millingen aan de Rijn (NL); Johannes Petrus Antonius Frambach, Nijmegen (NL)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/198,389

(22) Filed: Aug. 4, 2011

(65) Prior Publication Data
US 2012/0081158 A1 Apr. 5, 2012

Related U.S. Application Data

(60) Provisional application No. 61/388,311, filed on Sep. 30, 2010.

(51) Int. Cl.
*H03L 7/06* (2006.01)
(52) U.S. Cl. ..................... 327/156; 327/147
(58) Field of Classification Search .............. 327/147, 327/156
See application file for complete search history.

(56) References Cited

U.S. PATENT DOCUMENTS

| 5,825,253 | A  |   | 10/1998 | Mathe et al. |
| 5,841,863 | A  | * | 11/1998 | Ryan et al. ................... 380/218 |
| 6,498,524 | B1 | * | 12/2002 | Kawasaki et al. ............ 327/158 |
| 6,690,215 | B2 |   | 2/2004  | McCune, Jr. et al. |
| 7,230,458 | B2 |   | 6/2007  | DaDalt |
| 7,750,742 | B2 |   | 7/2010  | Cho et al. |
| 7,777,576 | B2 |   | 8/2010  | Wajeed et al. |
| 2005/0186920 | A1 |   | 8/2005  | Staszewski et al. |
| 2007/0096833 | A1 |   | 5/2007  | Maurer et al. |
| 2008/0098253 | A1 | * | 4/2008  | Lee et al. ........................ 713/503 |
| 2008/0315928 | A1 |   | 12/2008 | Waheed et al. |
| 2010/0141316 | A1 |   | 6/2010  | Weltin-Wu et al. |
| 2010/0198575 | A1 | * | 8/2010  | Hollis .............................. 703/14 |
| 2012/0081158 | A1 | * | 4/2012  | Mateman et al. ............. 327/156 |

OTHER PUBLICATIONS

Nenad Pavlovic et al. "A 5.3GHz Digital-to-Time-Converter-Based Fractional-N All-Digital PLL." 2011 IEEE International Solid-State Circuits Conference, Feb. 21, 2011, pp. 54-56, ISSCC 2011/Session 3/RF Techniques/3.2.
Staszewski et al. "All-Digital Frequency Synthesizer in Deep-Submicron CMOS." Copyright 2006, pp. 1-261, John Wiley & Sons, Inc., Hoboken, New Jersey.

* cited by examiner

*Primary Examiner* — Adam Houston
(74) *Attorney, Agent, or Firm* — Coats & Bennett, P.L.L.C.

(57) ABSTRACT

A digital phase locked loop (DPLL) operates in the frequency domain. The period (and hence frequency) of a reference frequency clock signal is determined by sampling with a (higher frequency) digitally controlled oscillator (DCO) clock. The period is compared to the period representation of a desired frequency, and the frequency error signal is integrated in a loop filter and applied as a control input to the DCO. To prevent spurious emissions resulting from the accumulation of quantization errors in the frequency determination and comparison operations, the arrival time of state transition edges of the reference frequency clock signal are randomized prior to sampling. The edge randomization control signal preferably has a triangular probability density function, and its spectrum has most significant energy outside the loop bandwidth of the DPLL; hence, the spurious emissions caused by the accumulation of quantization errors are filtered out by the loop filter.

16 Claims, 7 Drawing Sheets

REFERENCE CLOCK SAMPLING DIGITAL PLL

This application claims priority to U.S. Provisional Patent Application Ser. No. 61/388,311, titled, "Reference Clock Sampling Digital PLL," filed Sep. 30, 2010, the disclosure of which is incorporated herein by reference in its entirety. Co-pending U.S. patent application Ser. No. 13/198,401, titled "Sampler Circuit," assigned to the assignee of this application and filed concurrently herewith, is incorporated herein by reference in its entirety.

FIELD OF INVENTION

The present invention relates generally to phase locked loop circuits, and in particular to a sampling digital phase locked loop that operates on frequency, rather than phase, error.

BACKGROUND

Figure 7:
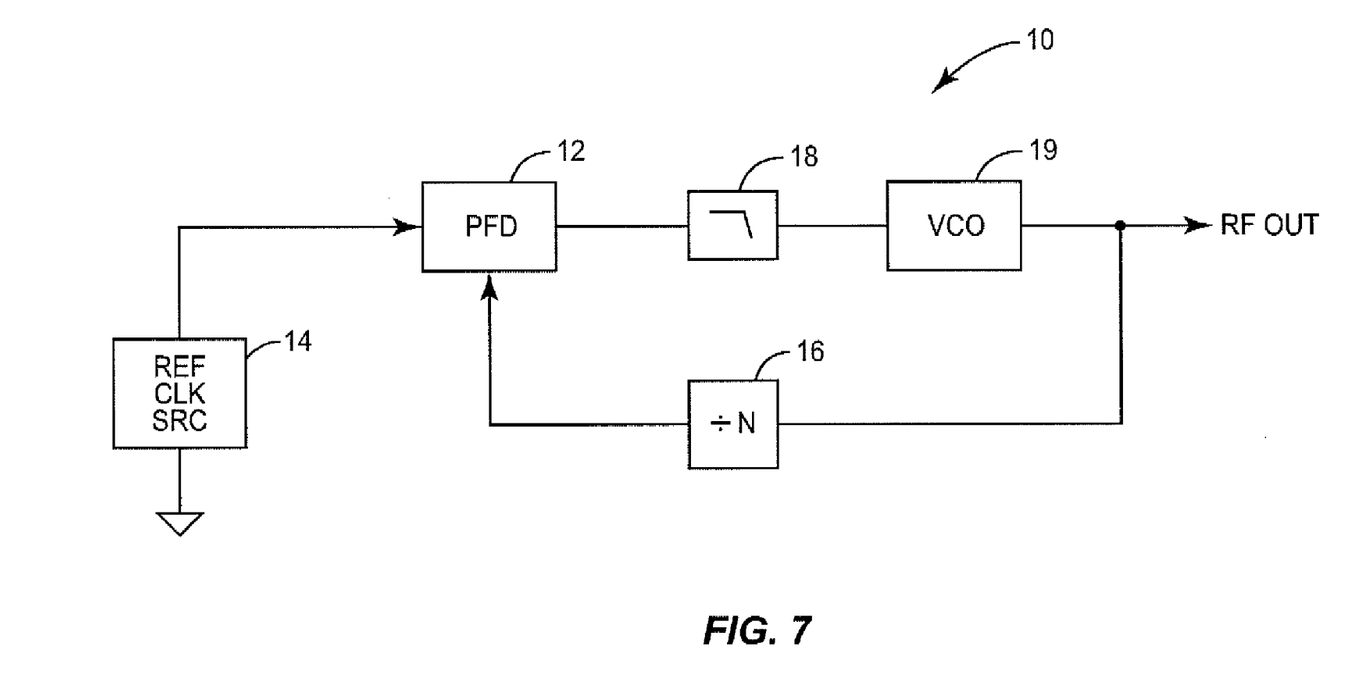
FIG. 7 is a functional block diagram of a prior art analog PLL.

A Phase Locked Loop (PLL) is a well-known circuit for deriving a steady (sometimes changeable or tunable) high frequency output signal. PLL are widely used in communication circuits, such as for generating carrier and local oscillator frequency signals for the modulation and demodulation of radio communication signals. PLLs compare a divided Radio Frequency (RF) signal with a reference clock to achieve phase lock, thus stabilizing the frequency of the undivided RF output. FIG. 7 depicts a functional block diagram of a conventional analog PLL. A Phase Frequency Detector (PFD) 12 compares the phases of a reference clock from a precision source 14, such as a crystal oscillator, to a feedback signal from a divider 16. The divider 16 divides down an RF output signal to the PLL operating frequency. The PFD 12 converts the phase difference between the reference clock and the divided RF signal into a control voltage level output. The PFD 12 output is low-pass filtered by a filter 18, and the control voltage is input to a Voltage Controlled Oscillator (VCO) 19 that changes the frequency of an RF output signal in response to the control voltage level.

Recently, digital PLL (DPLL) architectures have evolved, in which the phase difference is measured in a quantized fashion and converted into a digital control code for a Digitally Controlled Oscillator (DCO). In phase-domain PLLs, substantial analog circuitry is required to achieve sufficiently fine phase resolution to meet the phase noise requirements. One such circuit is a time-to-digital converter (TDC). A TDC is a device for converting a signal comprising pulses (or state transition edges) into a digital representation of their time indices. That is, a TDC outputs the time of arrival for each pulse, or edge, of a periodic signal.

Prior art phase-domain DPLLs have numerous deficiencies. Accurate representation of the control parameter in the phase domain requires infinite dynamic range (since the phase always increases). Practical implementation often requires $N*2\pi$ wrapping and a large accumulator. The computation clock must be a retimed version of the reference clock. These clocks are asynchronous relative to each other, which may cause meta-stability problems. The DCO requires a frequency control code, so the phase must be converted to frequency. The TDC is an analog block, and typically has analog impairments such as mismatch; it often requires substantial area and also may draw significant current. Finally, the TDC requires analog design knowledge and is not very portable across semiconductor process generations (e.g. CMOS nodes like 65 nm, 40 nm and 32 nm).

SUMMARY

According to one or more embodiments described herein, a digital phase locked loop (DPLL) operates in the frequency domain. The period (and hence frequency) of a reference frequency clock signal is determined by sampling with a (higher frequency) DCO clock. The period is compared to the period representation of a desired frequency, and the frequency error signal is integrated in a loop filter and applied as a control input to the DCO. To prevent spurious emissions resulting from the accumulation of quantization errors in the frequency determination and comparison operations, the arrival time of state transition edges of the reference frequency clock signal are randomized prior to sampling. The edge randomization control signal preferably has a triangular probability density function, and its spectrum has most significant energy outside the loop bandwidth of the DPLL; hence, the spurious emissions caused by the accumulation of quantization errors are filtered out by the loop filter.

One embodiment relates to a frequency domain digital phase locked loop (DPLL). The DPLL includes a digitally controller oscillator (DCO) operative to generate a clock signal having a frequency responsive to an applied digital control input. The DPLL also includes a delay modulator circuit operative to receive a reference frequency clock signal, and to randomize the timing of state transition edges in the reference frequency clock signal, generating a randomized reference frequency clock signal having the same long-term frequency as the reference frequency clock signal. The DPLL further includes a sampler circuit operative to sample the randomized reference frequency clock signal at the DCO clock signal frequency and to determine the period of the randomized reference frequency clock signal. The DPLL additionally includes a comparator operative to compare the determined period of the randomized reference frequency clock signal with a frequency control word representing the period of a desired frequency, and to generate a frequency error signal. Finally, the DPLL includes a loop filter operative to integrate the frequency error signal and to generate a digital control input operative to drive the DCO to generate an output signal at the desired frequency.

Another embodiment relates to a method of operating a frequency domain DPLL. The timing of state transition edges of a reference frequency clock signal is randomized. The frequency of the randomized reference frequency clock signal is determined. The determined frequency of the randomized reference frequency clock signal is compared with a desired frequency to generate a frequency error. A DCO is controlled with the frequency error to drive the DCO to output the desired frequency. Randomizing the timing of state transition edges of a reference frequency clock signal avoids the accumulation of quantization errors in determining a reference frequency that would lead to spurious emissions in the DPLL output.

DETAILED DESCRIPTION

Figure 1:
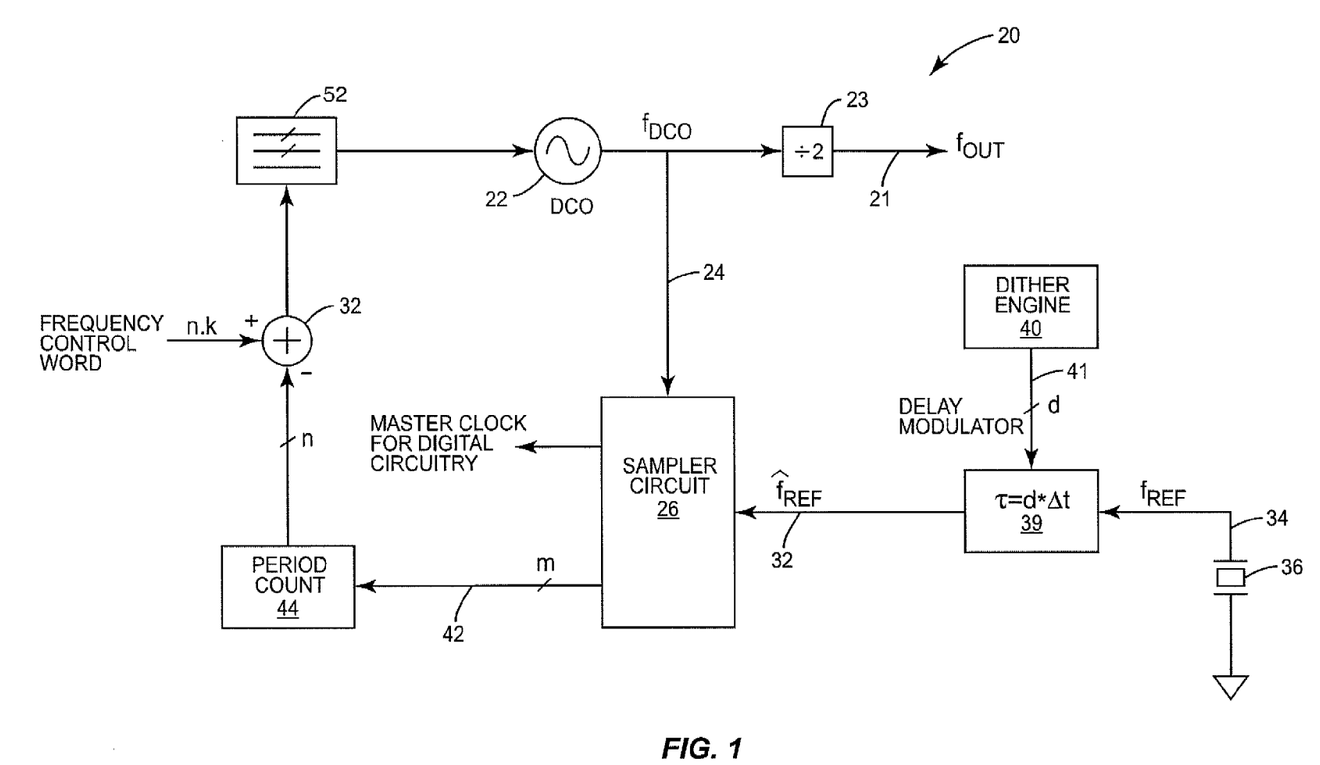
FIG. 1 is a functional block diagram of a sampling DPLL architecture according to one embodiment of the present invention.

FIG. 1 depicts a sampling Digital Phase Locked Loop (DPLL) architecture 20, according to one embodiment of the present invention. The DPLL 20 includes a Digitally Controlled Oscillator (DCO) 22, sampler circuit 26 (depicted in greater detail in FIG. 2), reference clock $f_{REF}$ 34, period counting circuit 44, difference circuit 32, and loop filter 52. The four DPLL 20 output signal 21 at frequency $f_{OUT}$ is, for example, half the DCO 22 output signal 24 frequency $f_{DCO}$ (divided in clock divider circuit 23). The DPLL 20 is based on sampling the reference clock $f_{REF}$ with the DCO clock $f_{DCO}$. The DPLL 20 is conceptually a frequency domain PLL, controlling a DCO 22. All computations are performed on the frequency rather than the phase.

In greater detail, the DCO 22 generates an output DCO clock 24 at frequency $f_{DCO}$. The DCO clock $f_{DCO}$ 24 is the sampling clock to a sampler circuit 26, which samples a randomized reference clock signal 32 having a frequency $\hat{f}_{REF}$. The reference clock signal 34 is derived from a reference clock source 36, such as a crystal oscillator. Transition edges of the reference clock signal 54 are randomized by a variable delay circuit 39, receiving a delay modulator signal 41 from a dither engine 40, in a manner explained in greater detail herein. Over the long term, $\hat{f}_{REF}=f_{REF}$; only the transition edges are randomized.

Figure 2:
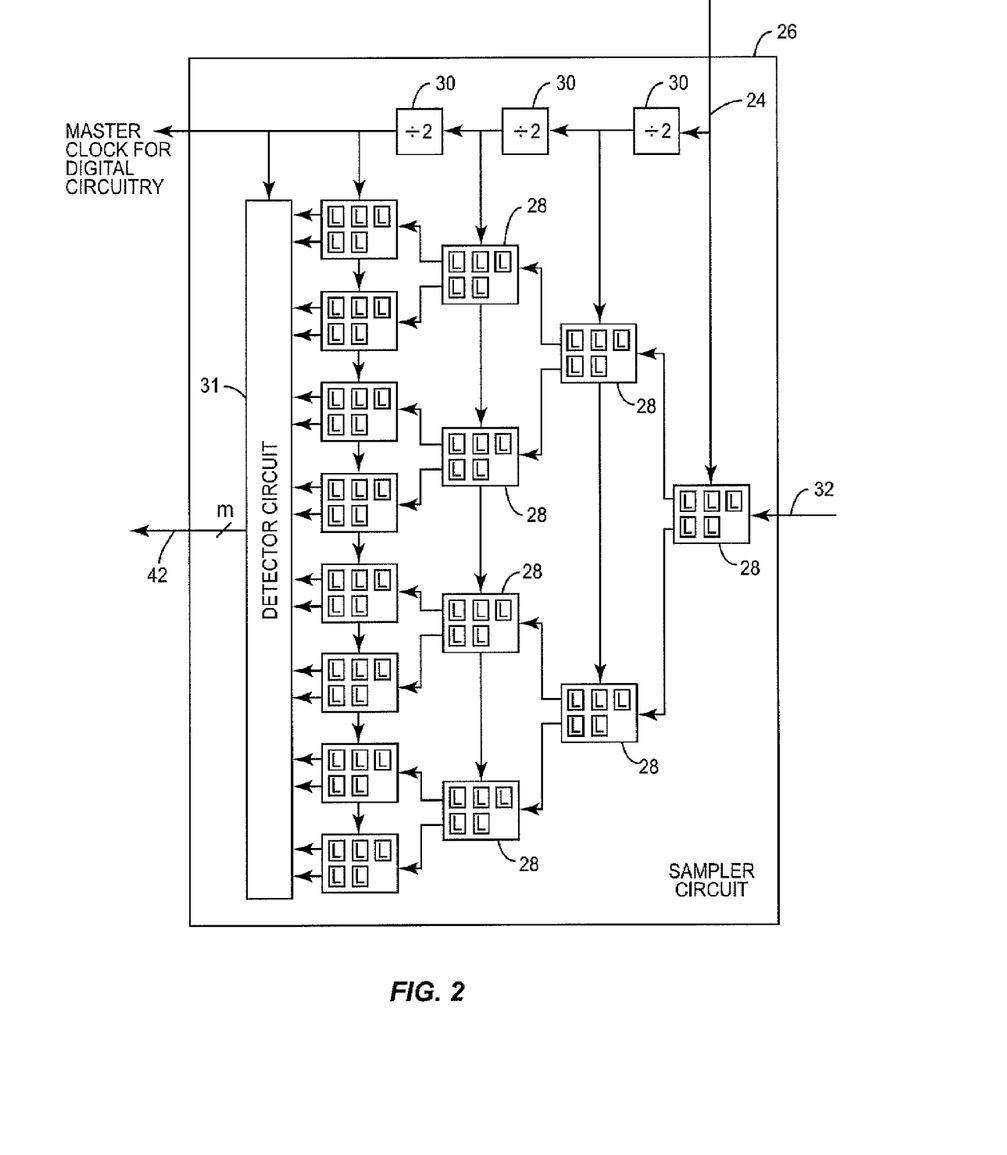
FIG. 2 is a functional block diagram of the sampler circuit of FIG. 1.

FIG. 2 depicts one embodiment of the sampler circuit 26, as described in the above-incorporated, co-pending patent application. Briefly, the sampler circuit 26 comprises a plurality of series-connected stages of sampler cells 28. Each successive stage comprises twice the number of sampler cells 28, arranged in parallel, as the previous stage. Also, the sampling clock 24 is divided by two at each stage by dividers 30. Hence, each successive stage is clocked at half the sampling frequency of the previous stage. A detector circuit 31 processes the outputs of the last stage of sampler cells 28.

Figure 3:
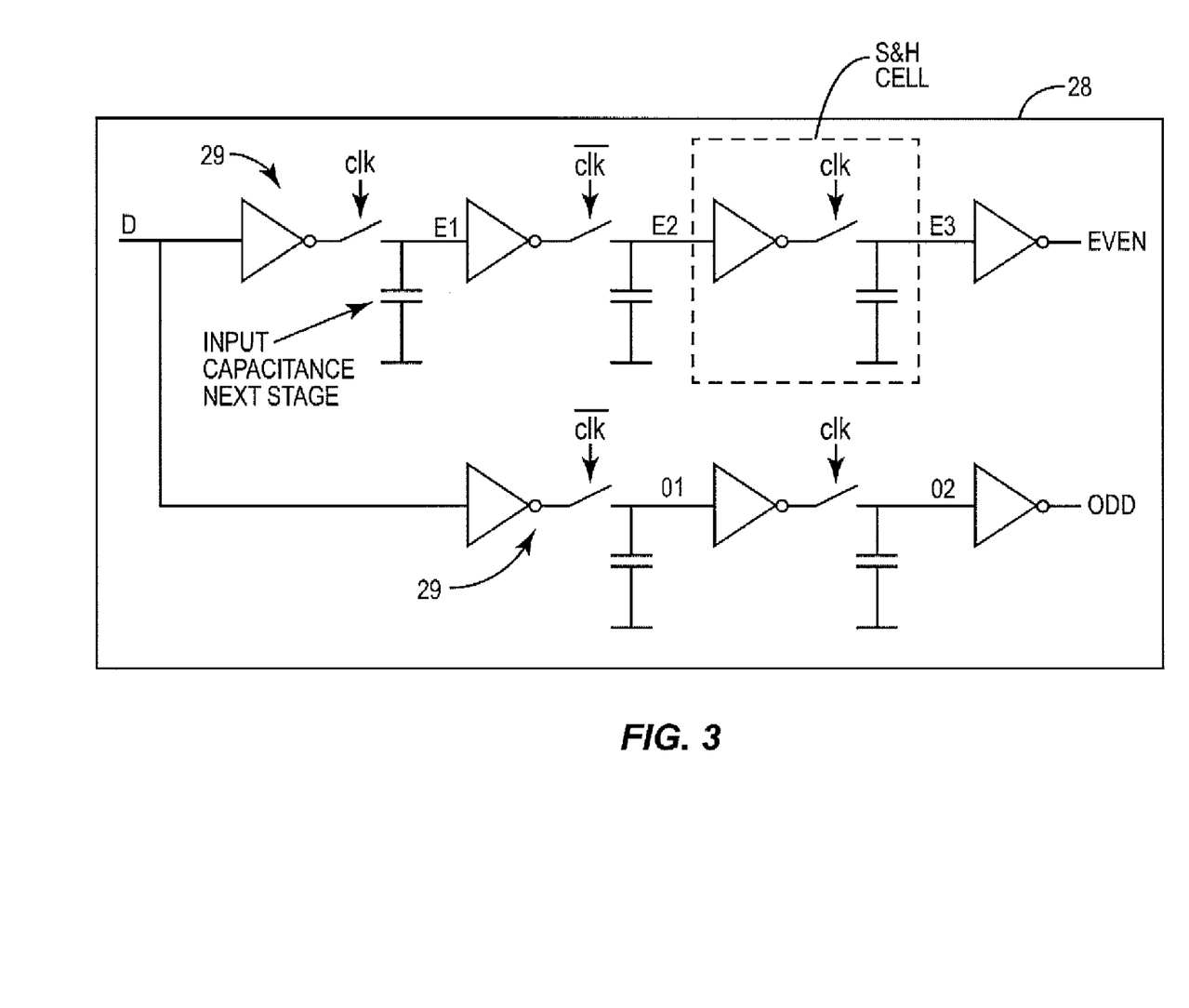
FIG. 3 is a functional block diagram of an analog sampler cell architecture.

FIG. 3 depicts a functional block diagram of a sampler cell 28. Each sampler cell 28 comprises two parallel branches of serially-connected clocked inverters 29. Each clocked inverter is operative to drive its output with the inverse of the state at its input during one phase of an applied sampling clock signal, and is operative to render its output at a high impedance, or tri-state, during the other phase of the sampling clock. Each successive clocked inverter 29 is clocked with an opposite component of a balanced sampling clock signal (that is, the clock signals applied to adjacent clocked inverters 29 are 180° out of phase). When connected serially, with alternating clocks, as depicted in FIG. 3, each clocked inverter operates as a Sample & Hold circuit with gain, wherein the holding capacitor is the input capacitance of the next inverter. Alternatively, the clocked inverters 29, when connected serially with alternating clock phases, may be considered as transparent latches having inverting outputs, as indicated by the L's in FIG. 2. As described in detail in the above-referenced co-pending patent application, the serially-connected clocked inverter structure samples the state of an applied input signal, outputting alternative samples on the upper, or "even" branch, and the lower, or "odd" branch, each at half the sampling clock 24 frequency. The sampler cell 28 operates in a power-efficient manner, with virtually no metastability hazard (due to the lack of any feedback memory mechanism, or regenerative gain, in the clocked inverters 29).

Referring back to FIGS. 1 and 2, the sampler circuit 26 is operative to sample the state of the input randomized reference clock signal 32, having a frequency $\hat{f}_{REF}$, using the DCO clock 24, having a frequency $f_{DCO}$, as a sampling clock. In a wireless transceiver, the usual choice for DCO 22 frequency is twice the required Local Oscillator (LO) frequency, an oversampling of 2× (as 2*LO is convenient to generate quadrature signals for mixers). The randomized reference clock $\hat{f}_{REF}$ 32 is thus sampled with 0.5*$T_{DCO}$ resolution. At each successive stage of sampler cells 28 in the sampler circuit 26, the number of sample outputs is doubled, and the frequency halved. The outputs of the final stage of sampler cells 28 are processed by a detector circuit 32. In one embodiment, the detector circuit 31 logically ORs the parallel samples to detect a logic-1, indicating a positive edge, or state transition, of the input randomized reference clock $\hat{f}_{REF}$ 32. The divided-down sampling clock 24 is also output as a general clock for the digital circuits in the DPLL 20.

A period counting circuit 44 counts the number of contiguous logic-1 samples, and outputs an n-bit digital value indicative of the period of the randomized reference clock $f_{REF}$ 32 in multiples of half-DCO periods. This period—i.e., the frequency of the randomized reference clock $\hat{f}_{REF}$ 32—is compared to the desired period count, represented as a predetermined frequency control word 48, at a difference circuit 50. The frequency error is integrated in the loop filter 52, which drives the DCO 22 to the desired frequency (and phase). The frequency control word 48 may be a fractional number, so any frequency can be programmed. The sampling DPLL output thus is not limited to integer multiples of the reference frequency.

While conceptually the frequency-domain DPLL 20 is very simple, in reality limit cycles can occur for some frequency control word values, caused by (endless) repetition of the same truncation error(s). This creates spurious emissions in the DPLL 22 output spectrum, which should be avoided in a wireless transmission system.

Without adjustment, the DPLL 20 in-band phase noise will be determined by the quantization error of the period estimation of a reference clock $f_{REF}$ 34 (i.e., the period count quantisation error). The resulting in-band phase noise can be computed with the following formula:

$$L = \frac{(2\pi)^2}{12} \cdot \left(\frac{\Delta t}{T_{DCO}}\right)^2 \cdot \frac{1}{f_{REF}} \cdot \left(\frac{f_{OUT}}{f_{DCO}}\right)^2 \quad (1)$$

where L is the normalized quantization noise power (or phase noise when expressed in dBc);

Δt is the quantisation step in seconds;

$T_{DCO}$ is the DCO 22 period in seconds;

$f_{REF}$ is the DPLL 22 reference clock 34 frequency in Hertz;

$f_{DCO}$ is the DCO 22 frequency in Hertz; and $f_{OUT}$ is the DPLL 20 output frequency in Hertz.

For a commonly-used reference clock frequency of 26 MHz, an output frequency of 2.4 GHz (ISM-band), and a DCO frequency of 4.8 GHz, the in-band phase noise is −81 dBc. Note that Δt is 0.5*$T_{DCO}$. This in-band phase noise is low enough for some applications, such as a Bluetooth or Zigbee transceiver. Accordingly, no additional Time-to-Digital Conversion circuitry is necessary to meet the phase noise requirements in such applications.

However, other wireless communication applications have more stringent requirements. In such cases, lower in-band phase noise can be achieved by using a higher reference frequency (−3 dB per doubling of the reference clock 34) or a higher DCO 22 frequency (−6 dB per doubling of the DCO clock 24, due to the higher multiplication factor). Another approach would be to reduce Δt (−6 dB per halving of Δt).

To prevent the limit cycles due to repetition of the quantization error pattern, the arrival time of the edges of the reference clock 34 are randomized by a programmable delay modulator 38 and dither engine 40. This breaks the periodic pattern and spreads the quantization error energy, removing spurious frequencies. The resulting randomized reference clock 32 has a frequency $\hat{f}_{REF} = f_{REF}$, but with randomized state transition edges.

Figure 4:
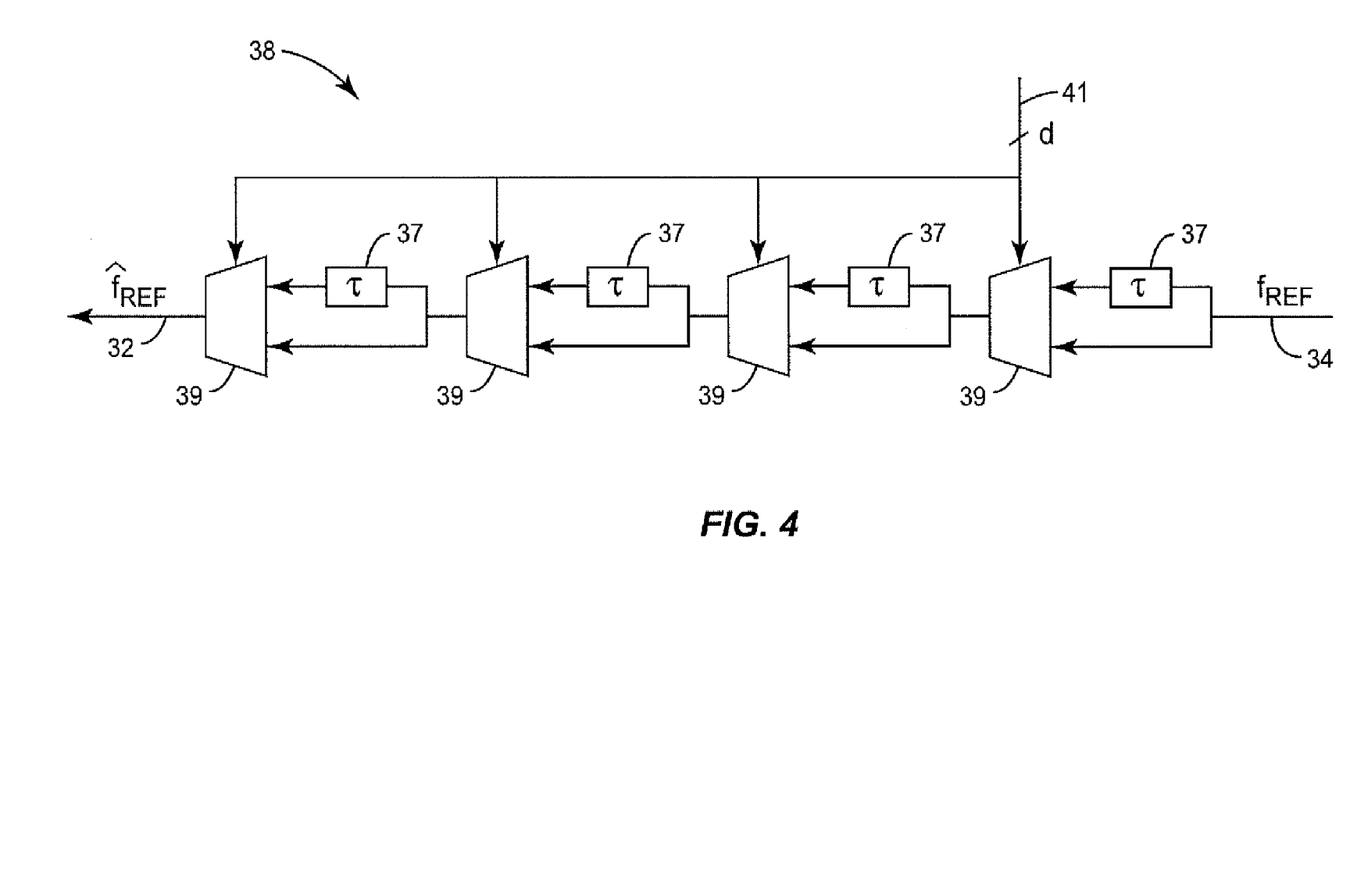
FIG. 4 is a conceptual functional circuit diagram of a delay modulator circuit.

FIG. 4 depicts a conceptual view of delay modulator 38 according to one embodiment, in which the reference clock 34 edge arrival time is altered by passing the clock signal 34 through a chain of buffer cells, the delay of which is selected by a digital control code 41. The delay modulator 38 functions as a series of multiplexers 39, each of which selects either the direct path or a path through a delay element 37, in response to the control word 41.

The delay modulator 38 is functionally a "time-DAC" with fine resolution. Since the average time delay is "zero," there is no long-term impact, and $\hat{f}_{REF} = f_{REF}$ 34. The state REF transition edge arrival time of the reference clock $f_{REF}$ 34 is modulated over the short term, and pushed erratically across the detector circuit 31 quantisation boundaries ($n*0.5*T_{DCO}$), breaking the limit cycle pattern.

The reference clock $f_{REF}$ 34 edge arrival time must be randomised to prevent spurious tones. Hence, the delay modulator 38 must be controlled by a stochastic control signal 41 generated by a dither engine 40. The control signal 41 should have a triangular probability density function (PDF) for optimal spreading. The spectrum of the dither must not contain energy in the DPLL 20 band of interest ("in-band"). All energy must be shaped outside the DPLL 20 loop bandwidth, so that it is suppressed by the loop filter 52. A simple dither signal that satisfies all these criteria is a high-pass filtered Pseudo Random Bit Sequence (PRBS) signal. Additionally or alternatively, subtractive dither can be used to suppress the introduced noise (e.g., in high performance wireless systems).

Figure 5:
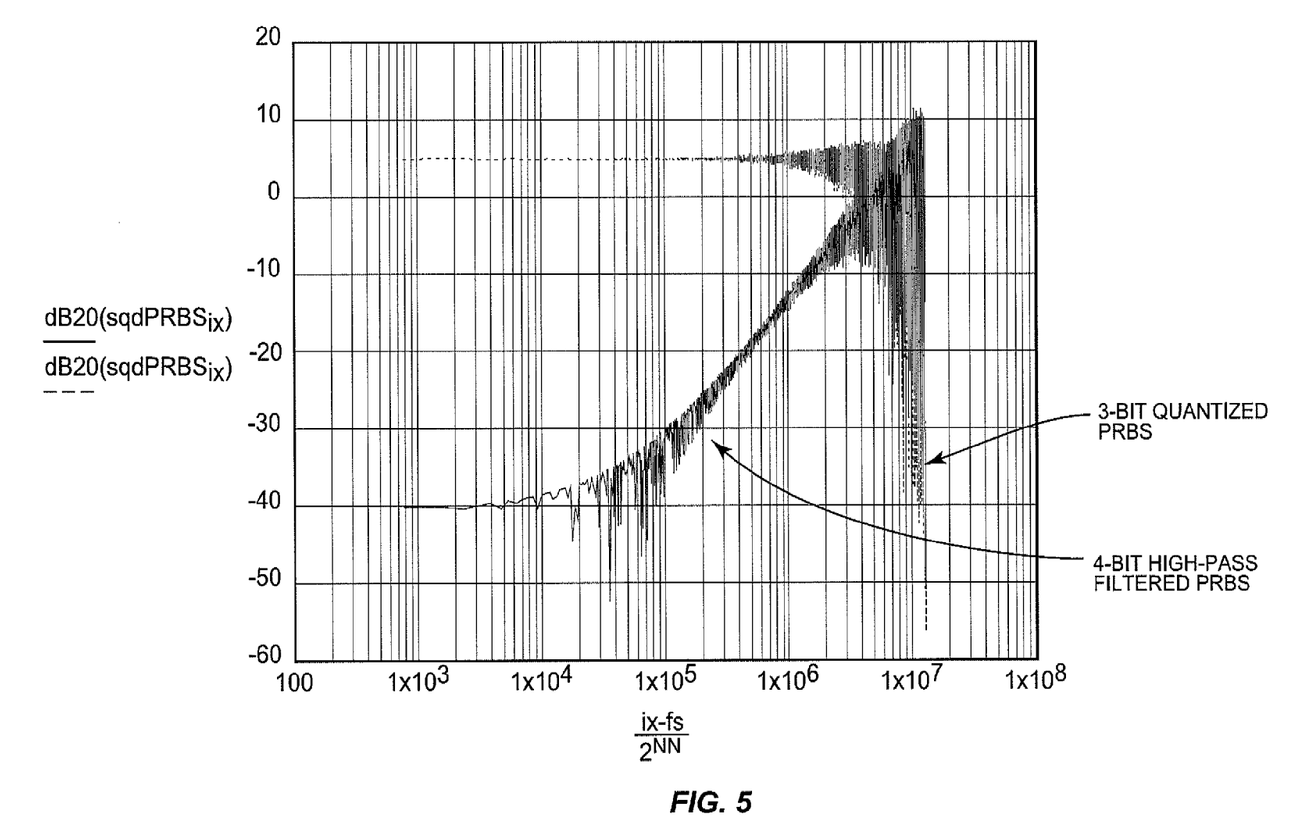
FIG. 5 is a graph of dither signal spectrum.

In one embodiment, the 4-bit (15-level) delay modulator 38 of FIG. 3, is driven by a PRBS generator of 3-bit width in the dither engine 40. High-pass filtering, $1-z^{-1}$, results in a 4-bit vector 41 (d=4) that drives the delay modulator 38. That is, the result of a mathematical operation on two 3-bit PRBS values (a present value and a previous value) requires 4 bits to store, as the result may be any positive or negative value over the range of the 3-bit values. The spectrum of this dither signal only contains significant energy outside the DPLL 20 loop bandwidth (usually <100 kHz), as depicted in FIG. 5. FIG. 5 is a graph of the 3-level quantized PRBS and the high-pass filtered PRBS ($f_{REF}$=26 MHz). The PRBS generator ensures sufficient randomness and, in combination with the high-pass filter, generates a triangular PDF.

While a triangular PDF is preferred in some embodiments, the present invention is not so limited. In other embodiments, different PDFs may work satisfactory, depending on the loop bandwidth and in-band noise requirements of the particular application of DPLL 20. Accordingly, a triangular PDF in the dither engine 40 is not a restriction or limitation of the present invention. Additionally, in general the number of delay cells (e.g., multiplexer 39 and delay element 37) in the delay modulator 38 can be less or more than 4, yielding more or less than 15 delay options.

Figure 6:
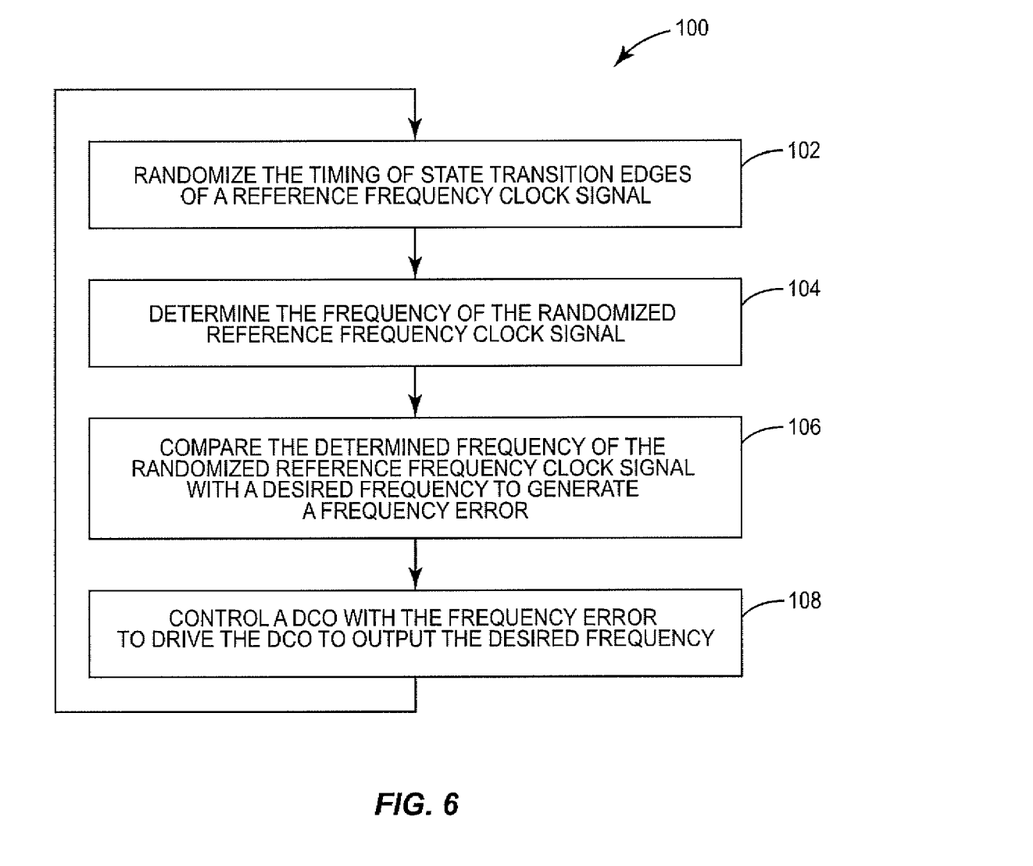
FIG. 6 is a flow diagram of a method of operating a DPLL.

FIG. 6 depicts the steps in a method 100 of operating a DPLL 20. Those of skill in the art will recognize that the method is continuous and ongoing. However, the method may be said to "begin" at step 102, in which the timing of state transition edges of a reference frequency clock signal are randomized. This avoids the accumulation of quantization errors in determining a reference frequency that would otherwise lead to spurious emissions in the DPLL output. In step 104, the frequency of the randomized reference frequency clock signal is determined, such as by determining its period. This determined frequency is compared to a desired frequency, at step 106, generating a frequency error. The frequency error is integrated in a loop filter, and then used to control a DCO at step 108, to drive the DCO output to the desired frequency.

Embodiments of the sampling DPLL 20 architecture described herein present numerous advantages over prior art, phase-domain DPLLs. The frequency domain implementation is much simpler than a phase domain implementation. All calculations operate within a limited dynamic range, so no wrapping or large accumulators are required. The frequency error signal generated by the comparator 50 is a relatively static signal. Embodiments described herein are suitable for 2-point modulation (i.e., add a modulation signal directly to DCO 22 and subtract the modulation signal from the comparator 50). The major part of the DPLL 20 may be coded in a Register Transfer Level (RTL) representation, and hence it is easily portable across semiconductor technologies. The architecture features a very predictable loop bandwidth and in-band phase noise level. The sampler circuit 26 automatically re-times the randomized reference clock $\hat{f}_{REF}$ 32 to the DCO clock $f_{DCO}$ 24, avoiding critical meta-stability problems.

The analog portion of the design consists of simple delay cells in the delay modulator 38 and a repetitive circuit structure for the sampler circuit 26 (i.e., sampler cells 28 comprising clocked inverters 29, and clock dividers 30). Although analog in functionality, porting is fairly easy to do, without stringent performance requirements—that is, only delay matching, rather than the absolute value of the delay, is important. Technology scaling eases the design challenges in every process generation (i.e., greater speed and finer time resolution are easily achieved).

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A frequency domain digital phase locked loop (DPLL), comprising:
    a digitally controlled oscillator (DCO) operative to generate a clock signal having a frequency responsive to an applied digital control input;
    a delay modulator circuit operative to receive a reference frequency clock signal, and to randomize the timing of state transition edges in the reference frequency clock signal, generating a randomized reference frequency clock signal having the same long-term frequency;
    a sampler circuit operative to sample the randomized reference frequency clock signal at the DCO clock signal frequency;
    a period determining circuit operative to determine the period of the randomized reference frequency clock signal;

a comparator operative to compare the determined period of the randomized reference frequency clock signal with a frequency control word representing the period of a desired frequency, and to generate a frequency error signal; and a loop filter operative to integrate the frequency error signal and to generate a digital control input operative to drive the DCO to generate an output signal at the desired frequency.

2. The DPLL of claim 1 further comprising a reference frequency clock source operative to generate the reference frequency clock signal.

3. The DPLL of claim 1 further comprising a dither circuit operative to control the delay modulator circuit to randomize the timing of state transition edges in the reference frequency clock signal.

4. The DPLL of claim 3 wherein the dither circuit comprises:
   a Pseudo Random Bit Sequence (PRBS) generator operative to generate a PRBS; and
   a high-pass filter operative to filter the PRBS; and
   wherein the dither circuit is operative to output the high-pass filtered PRBS as a control signal to control the delay modulator circuit.

5. The DPLL of claim 4 wherein the high-pass filtered PRBS exhibits a triangular probability density function.

6. The DPLL of claim 4 wherein the delay modulator circuit comprises a plurality of series-connected programmable delay elements, each operative to selectively delay a propagated input signal by a predetermined amount in response to the control signal.

7. The DPLL of claim 3 wherein the energy of the spectrum of the dither circuit output is substantially outside the DPLL loop bandwidth.

8. The DPLL of claim 1 wherein the sampler circuit comprises:
   plurality of series-connected stages of sampler cells, wherein each successive stage comprises twice the number of sampler cells, arranged in parallel, as the previous stage; and
   a plurality of clock dividers operate to divide the sampling clock by two at each series-connected stage of sampler cells; and
   a detector circuit operative to detect one or more randomized reference frequency clock signal state transition edges by processing the outputs of the last stage of sampler cells.

9. The DPLL of claim 8 wherein each sampler cell is operative to demultiplex samples of the randomized reference frequency clock signal in each of two parallel branches comprising series-connected clocked inverters, and wherein the clocked inverters in each branch are alternatively clocked by the sampling clock and an inverted sampling clock.

10. A method of operating a frequency domain digital phase locked loop (DPLL), comprising:
    randomizing the timing of state transition edges of a reference frequency clock signal;
    determining the frequency of the randomized reference frequency clock signal;
    comparing the determined frequency of the randomized reference frequency clock signal with a desired frequency to generate a frequency error; and
    controlling a digitally controlled oscillator (DCO) with the frequency error to drive the DCO to output the desired frequency.

11. The method of claim 10 further comprising integrating the frequency error in a loop filter prior to controlling the DCO.

12. The method of claim 10 wherein randomizing the timing of state transition edges of a reference frequency clock signal comprises controlling a delay modulator with a control signal having a triangular probability density function.

13. The method of claim 10 wherein randomizing the timing of state transition edges of a reference frequency clock signal comprises controlling a delay modulator with a control signal, the spectrum of which contains substantial energy outside of the DPLL loop bandwidth.

14. The method of claim 13 further comprising generating the control signal by high-pass filtering a Pseudo Random Bit Sequence.

15. The method of claim 13 wherein controlling a delay modulator with a control signal comprises selectively delaying the reference frequency clock signal at one or more successive stages of the delay modulator in response to the control signal.

16. The method of claim 15 wherein the control signal comprises a multi-bit digital value, each bit corresponding to a stage of the delay modulator, and wherein each bit is operative to cause the delay modulator to selectively delay a signal at the corresponding stage by a predetermined amount.

* * * * *